United States Patent
Ohba

(10) Patent No.: US 10,658,480 B2
(45) Date of Patent: May 19, 2020

(54) MEMORY DEVICE

(71) Applicant: TOSHIBA MEMORY CORPORATION, Minato-ku, Tokyo (JP)

(72) Inventor: Ryuji Ohba, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/124,114

(22) Filed: Sep. 6, 2018

(65) Prior Publication Data
US 2019/0296118 A1    Sep. 26, 2019

(30) Foreign Application Priority Data

Mar. 22, 2018   (JP) .................................. 2018-055017

(51) Int. Cl.
| H01L 29/423 | (2006.01) |
| H01L 29/66 | (2006.01) |
| H01L 29/51 | (2006.01) |
| H01L 27/11582 | (2017.01) |
| H01L 27/11556 | (2017.01) |
| H01L 27/11514 | (2017.01) |
| H01L 27/11578 | (2017.01) |
| H01L 27/11551 | (2017.01) |

(52) U.S. Cl.
CPC .. *H01L 29/42348* (2013.01); *H01L 27/11514* (2013.01); *H01L 27/11551* (2013.01); *H01L 27/11556* (2013.01); *H01L 27/11578* (2013.01); *H01L 27/11582* (2013.01); *H01L 29/517* (2013.01); *H01L 29/66825* (2013.01); *H01L 29/66833* (2013.01); *H01L 2924/1438* (2013.01)

(58) Field of Classification Search
CPC ......... H01L 29/42348; H01L 27/11582; H01L 27/11556; H01L 29/517; H01L 29/66825; H01L 29/66833; H01L 27/11551; H01L 27/11578; H01L 27/11514; H01L 2924/1438

See application file for complete search history.

(56) References Cited

U.S. PATENT DOCUMENTS

| 9,406,694 B1 | 8/2016 | Ikeno et al. | |
| 9,721,654 B1 * | 8/2017 | Ohba | ................. G11C 13/0007 |
| 9,899,410 B1 * | 2/2018 | Cho | ................. H01L 29/42332 |

(Continued)

*Primary Examiner* — Feifei Yeung Lopez
(74) *Attorney, Agent, or Firm* — Foley & Lardner LLP

(57) ABSTRACT

A memory device includes plural electrode layers stacked in a first direction, a semiconductor layer interacting with the plural electrode layers and extending in the first direction, a first insulating film provided between the semiconductor layer and at least one electrode layer and extending along the semiconductor layer in the first direction, and a charge trapping film provided between the electrode layer and the first insulating film. The memory device further includes a second insulating film provided between the charge trapping film and the first insulating film and in contact with the first insulating film. In a flat band state, the charge trapping film has a first trap level located at a level deeper than a conduction band of the semiconductor layer and the second insulating film has a second trap level that is closer to the conduction band of the semiconductor layer than the first trap level.

10 Claims, 24 Drawing Sheets

(56) References Cited

U.S. PATENT DOCUMENTS

| | | |
|---|---|---|
| 2009/0302365 A1* | 12/2009 | Bhattacharyya ....... B82Y 10/00 |
| | | 257/298 |
| 2014/0061770 A1* | 3/2014 | Lee ................... H01L 29/66825 |
| | | 257/324 |
| 2016/0079252 A1 | 3/2016 | Yamashita |
| 2017/0213840 A1 | 7/2017 | Sudo et al. |
| 2017/0236827 A1 | 8/2017 | Hirotani et al. |
| 2017/0243945 A1 | 8/2017 | Sekine et al. |
| 2019/0013074 A1* | 1/2019 | Bhattacharyya ... G11C 14/0063 |

* cited by examiner

MEMORY DEVICE

CROSS-REFERENCE TO RELATED APPLICATIONS

This application claims the benefit of and priority to Japanese Patent Application No. 2018-055017, filed Mar. 22, 2018, the entire contents of which are incorporated herein by reference.

FIELD

Embodiments described herein relate generally to a memory device.

BACKGROUND

In memory devices including three-dimensionally arranged memory cells, sizes of the memory cells may be reduced to increase memory capacities of the memory devices.

DETAILED DESCRIPTION

Figure 1:
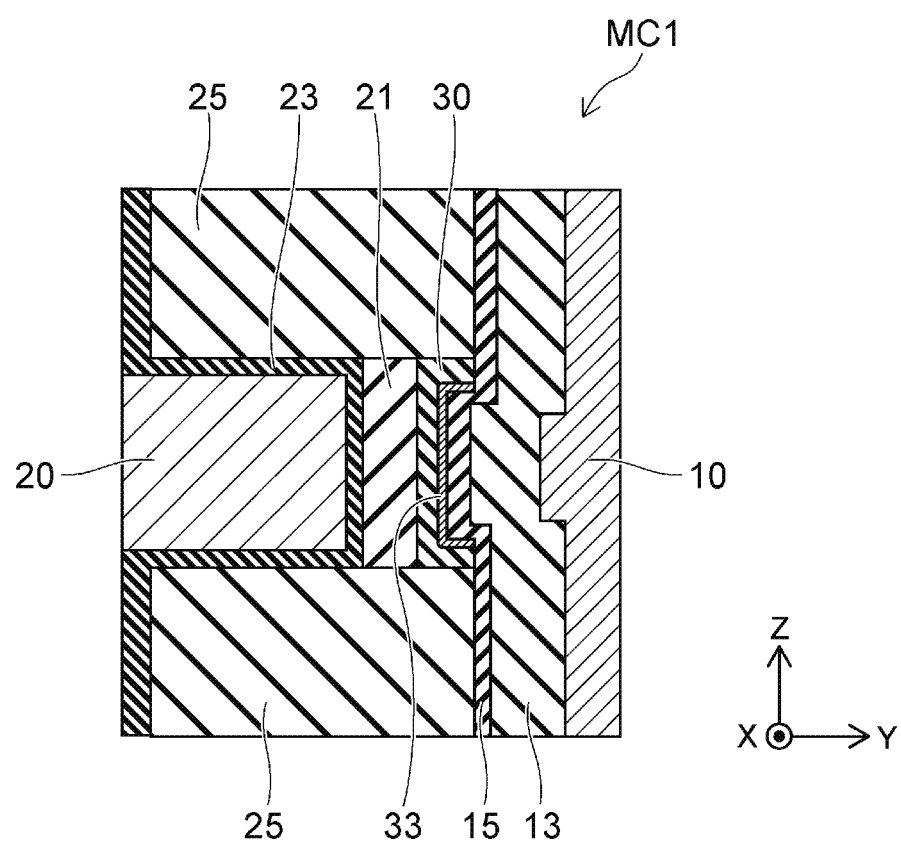
FIG. 1 is a sectional view illustrating a memory cell of a memory device according to some embodiments.

Embodiments of the present disclosure provide a memory device including a memory cell capable of reducing a size of a charge retention region.

According to some embodiments, a memory device may include plural electrode layers that are stacked in a first direction, a semiconductor layer that intersects with the plural electrode layers and extends in the first direction, a first insulating film that is provided between the semiconductor layer and at least one electrode layer among the plural electrode layers and extends along the semiconductor layer in the first direction, and a charge trapping film that is provided between the electrode layer and the first insulating film. The memory device may further include a second insulating film that is provided between the charge trapping film and the first insulating film and is in contact with the first insulating film. In a flat band state, the charge trapping film may have a first trap level located at a level deeper than a conduction band of the semiconductor layer and the second insulating film may have a second trap level located at a level closer to the conduction band of the semiconductor layer than the first trap level.

Hereinafter, some embodiments will be described with reference to the drawings. The same reference numerals are given to the same portions in the drawings, the detailed description thereof will not be repeated, and only differences will be described. In the drawings, a relation between the thickness and the width of each portion, a ratio between the sizes of the portions, and the like may not be the same as the actual relation, ratio, and the like. Even in the same portions, the dimensions or ratios may differ depending on the drawings.

Further, in the drawings, the arrangement and configuration of each portion will be described using the X, Y, and Z axes. The X, Y, and Z axes are orthogonal to each other and indicate X, Y, and Z directions. The Z direction may be set to the upper side and its opposite direction may be set to the lower direction for description.

FIG. 1 is a sectional view illustrating a memory cell MC1 of a memory device according to some embodiments. A memory cell MC includes a semiconductor layer 10, a charge layer 20, and a charge trapping film 30. The charge trapping film 30 is provided between the semiconductor layer 10 and the electrode layer 20. The electrode layer 20 is disposed between inter-layer insulating films 25. The semiconductor layer 10 extends in the Z direction along end surfaces of the inter-layer insulating films 25.

The memory cell MC may store data by retaining charges injected from the semiconductor layer 10 to the charge trapping film 30. The charge trapping film 30 may be, for example, a hafnium silicate film (HfSiO).

Insulating films 13 and 15 are disposed between the semiconductor layer 10 and the charge trapping film 30. The insulating film 13 is located between the semiconductor layer 10 and the insulating film 15, and the insulating film 15 is located between the insulating film 13 and the charge trapping film 30. The insulating films 21 and 23 are disposed between the electrode layer 20 and the charge trapping film. The insulating film 23 is provided between the electrode layer 20 and the insulating film 21, and the insulating film 21 is located between the insulating film 23 and the charge trapping film 30. The insulating films 13 and 21 may be, for example, silicon oxide films. The insulating film 15 may be, for example, a silicon nitride film. The insulating film 23 may be, for example, an aluminum oxide film.

In the memory cell MC1, a metal layer 33 is disposed between the insulating film 15 and the charge trapping film 30. For example, the metal layer 33 has a layer thickness equal to or less than 0.1 nanometers (nm). In some embodiments, since the metal layer 33 is disposed between the insulating film 15 and the charge trapping film 30, it is possible to improve a charge storage capability of the charge trapping film 30.

Figure 2A:
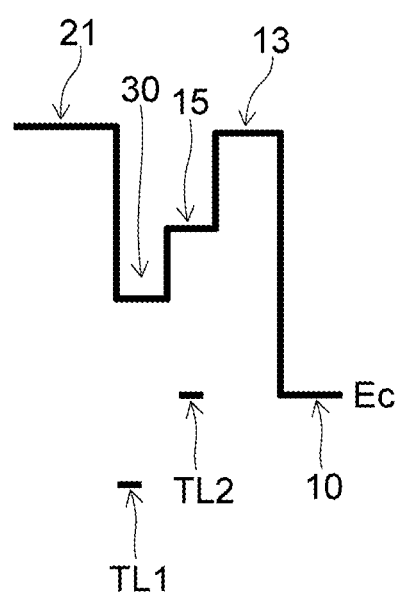
FIG. 2A and FIG. 2B are diagrams illustrating operations of the memory cell of the memory device according to some embodiments.
Figure 2B:
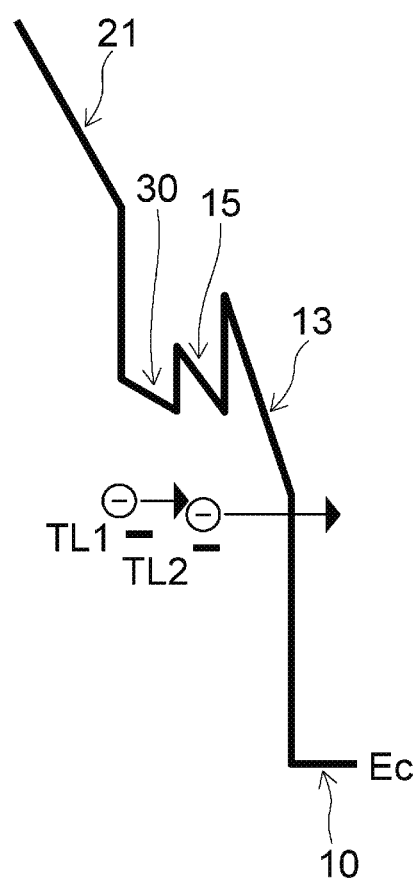

FIG. 2A and FIG. 2B are diagrams illustrating an operation of the memory cell of the memory device according to some embodiments. FIG. 2A is a diagram illustrating an energy band, for example, in a flat band state. FIG. 2B is a diagram illustrating an energy band, for example, when an erase voltage $V_{ERASE}$ is given between the semiconductor layer 10 and the electrode layer 20.

In FIG. 2A and FIG. 2B, the insulating film 23 and the electrode layer 20 are not illustrated. Although the metal layer 33 is not illustrated, an operation of the memory cell is the same as an operation when there is the metal layer 33 to be described below. A potential difference between the charge trapping film 30 and a conduction band Ec of the semiconductor layer 10 may occur in accordance with voltage to be applied between the semiconductor layer 10 and the electrode layer 20.

As illustrated in FIG. 2A, the charge trapping film 30 has a first trap level TL1, and the insulating film 15 has a second trap level TL2. The first trap level TL1 is located at an energy level deeper than the bottom of the conduction band Ec of the semiconductor layer 10. The second trap level TL2 is located at an energy level closer to the bottom of the conduction band Ec than the first trap level.

The insulating film 13 may function as, for example, a tunnel insulating film. When a write voltage $V_{WRITE}$ is applied between the semiconductor layer 10 and the electrode layer 20, charges may pass through the insulating film 13 from the semiconductor layer 10 to be injected to the insulating film 15 and the charge trapping film 30. In this example, since the first trap level TL1 is at the energy level deeper than the bottom of the conduction band Ec, the charges may be trapped at the first trap level TL1. Thus, the data retention capability of the memory cell MC1 is improved.

As illustrated in FIG. 2B, when an erase voltage $V_{ERASE}$ is given between the semiconductor layer 10 and the electrode layer 20, an energy difference between the first trap level TL1 and the second trap level TL2 decreases and the charges retained at the first trap level TL1 may be discharged to the semiconductor layer 10 via the second trap level.

In the example, the insulating film 15 that has the second trap level TL2 may be in contact with the insulating film 13. Thus, the electrons retained at the first trap level TL1 may be easily discharged to the semiconductor layer 10. That is, it is easy to erase data retained in the memory cell MC1.

Even when the charge storage unit includes the metal layer 33 in addition to the charge trapping film 30 or includes only the metal layer, the first trap level TL1 in the charge storage unit may be located at the energy level deeper than the bottom of the conduction band Ec of the semiconductor layer 10, and the second trap level TL2 of the insulating film 15 may be located at the energy level closer to the bottom of the conduction band Ec than the first trap level as usual. Therefore, the same effects can be obtained. This is because the insulating film contains a metal oxide as a main component and a trap level of metal is formed at a position deeper than the trap level of the insulating film including the silicon nitride film as a main component.

Figure 3A:
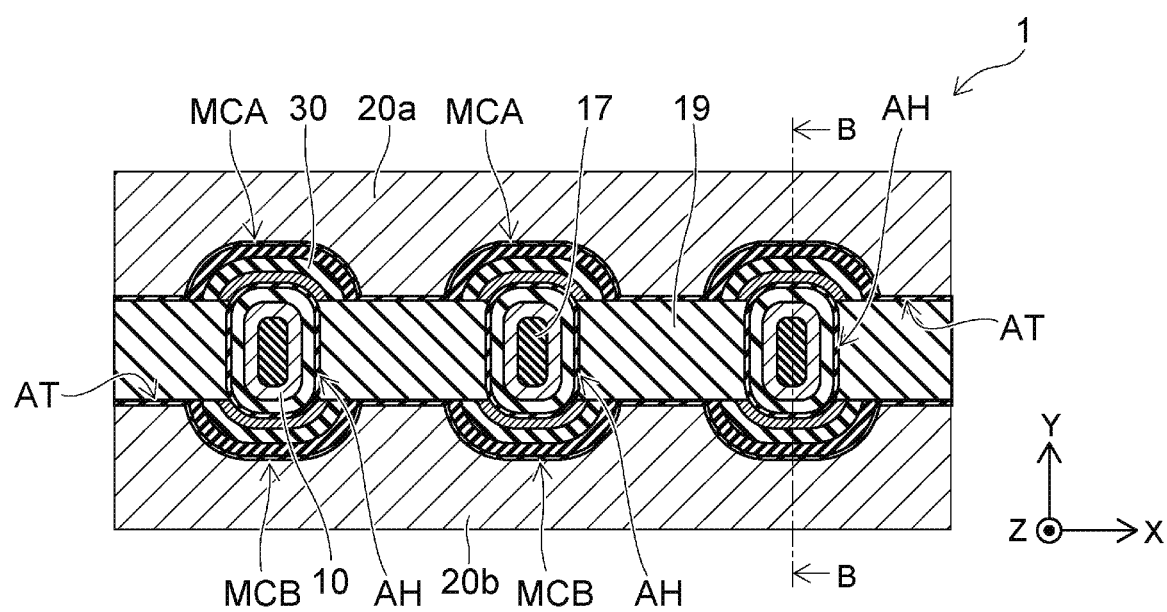
FIG. 3A and FIG. 3B are views illustrating the memory device according to some embodiments.
Figure 3B:
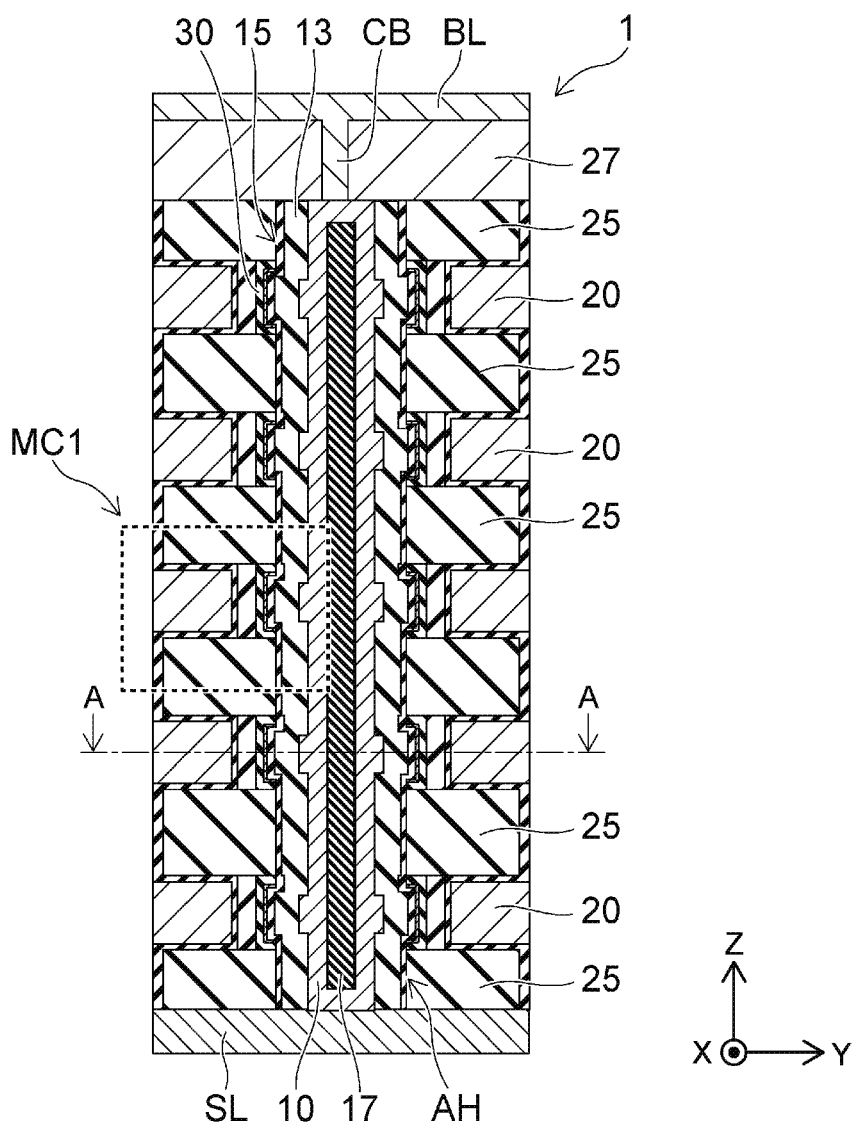

FIG. 3A and FIG. 3B are views illustrating the memory device 1 according to some embodiments. FIG. 3A is a sectional view taken along the line A-A illustrated in FIG. 3B. FIG. 3B is a sectional view taken along the line B-B illustrated in FIG. 3A.

As illustrated in FIG. 3A, the memory device 1 includes electrode layers 20a and 20b disposed with the insulating film 19 interposed therebetween. In the following description, the electrode layers 20a and 20b will be described separately and will be described comprehensively as the electrode layers 20.

Plural memory holes AH are provided between the electrode layers 20a and 20b. The memory holes AH may penetrate through the insulating film 19 to extend in the Z direction. The memory holes AH each include the semiconductor layers 10 and insulating cores 17. The semiconductor layer 10 surrounds the insulating core 17.

The memory device 1 includes plural memory cells MCA and MCB. The memory cell MCA is provided in the side of (or in the same side as) the electrode layer 20a of the semiconductor layer 10, and the memory cell MCB is provided in the side of (or in the same side as) the electrode layer 20b of the semiconductor layer 10. The memory cells MCA and MCB each include the charge trapping film 30 and share the semiconductor layer 10.

As illustrated in FIG. 3B, the memory device 1 includes the plural electrode layers 20 stacked in the Z direction. For example, the electrode layers 20 are stacked above the source line SL and between the inter-layer insulating films 25. The memory holes AH extend in the Z direction to intersect the plural electrode layers 20 and contain the semiconductor layer 10, the insulating films 13, the insulating films 15, and the insulating core 17 therein.

The insulating core 17 extends in the Z direction, and the semiconductor layer 10 surrounds the insulating core 17. The insulating films 13 and 15 extend along the semiconductor layer 10 in the Z direction. The insulating film 15 may cover a wall surface of the memory hole AH.

The semiconductor layer 10 is connected to the source line SL at its lower end. The upper end of the semiconductor layer 10 is connected to a bit line BL via a connection plug CB. For example, the bit line BL is provided on the insulating film 27 provided on the uppermost inter-layer insulating film 25. The connection plug CB penetrates through the insulating film 27 in the Z direction to connect the semiconductor layer 10 to the bit line BL.

A region surrounded by dotted lines in FIG. 3B corresponds to the memory cell MC1 illustrated in FIG. 1. That is, the memory device 1 includes the plural memory cells MC1 arranged along the semiconductor layer 10 in the Z direction. The plural memory cells MC1 each include the charge trapping film 30 and the metal layer 33. The memory cells MCA and MCB illustrated in FIG. 3A are the memory cell MC1 and are illustrated using different reference numerals to show a relation between the electrode layers 20a and 20b.

As illustrated in FIG. 1 and FIG. 3B, the charge trapping films 30 are separated from each other in the Z direction, and the metal layers 33 are separated from each other in the Z direction. Thus, it is possible to prevent the charges retained in the charge trapping film 30 from moving between the memory cells MC1.

In the memory cell MC1, by setting the charge trapping film 30 in respective memory regions to be separated from each other and setting the metal layers 33 in respective memory regions to be separated from each other, for example, it is possible to further reduce the size of the memory cell than a memory cell structure including a floating gate of polysilicon in the Y direction.

For example, when the metal layer 33 or the trap film 30 containing a metal oxide as a main component is provided in the memory cell MC1 as shown in FIG. 1 and FIG. 3B, charge trap efficiency is larger than in a structure in which polysilicon is used in a charge storage unit. Therefore, it is possible to store charges in a thin film. When the silicon nitride film 15 is used as an erasing assist in the memory cell MC1 as shown in FIG. 1 and FIG. 3B, the memory cell can be more easily formed than in a structure in which polysilicon is used as erasing assist from a metal oxide or metal. For example, it is difficult to form a thin layer equal to or less than 3 nm using polysilicon, but it is easy to form a thin film containing a metal oxide or metal or a thin film of silicon nitride. Further, since movement of charges is less in a silicon nitride film than polysilicon, it is possible to prevent charges from moving between the memory cells MC1 via the insulating film 15. Therefore, in some embodiments, as shown in FIG. 3B, portions of the insulating film 15 in the memory cell MC1 may not be separated from each other in the Z direction.

It is possible to cause the thickness of a portion protruding to the outside (e.g., a direction orienting toward the electrode 20) from the wall surface of the memory hole AH of the memory cell MC1 to be thin in the Y direction. Thus, it is possible to reduce the size of the memory cell MC1 and increase its density. As a result, it is possible to increase a memory capacity of the memory device 1.

Next, a method of fabricating the memory device 1 according to some embodiments will be described with reference to FIG. 4A to FIG. 9B. FIG. 4A to FIG. 9B are sectional views illustrating fabricating processes of the memory device 1.

FIG. 4A to FIG. 4C and FIG. 9A are views illustrating the cross section corresponding to FIG. 3B. FIG. 5A to FIG. 8B and FIG. 9B are views illustrating the cross section corresponding to FIG. 1.

Figure 4A:
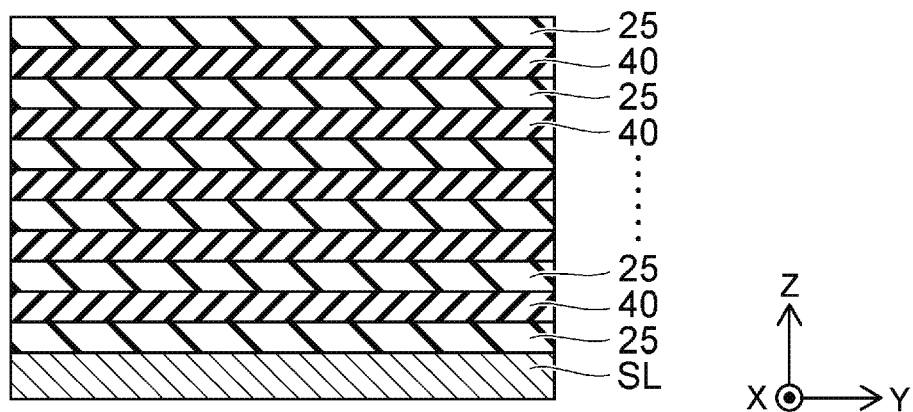
FIG. 4A to FIG. 4C are sectional views illustrating processes of fabricating the memory device according to some embodiments.

As illustrated in FIG. 4A, the inter-layer insulating films 25 and sacrificial films 40 are alternately stacked on the source line SL. The inter-layer insulating film 25 may be, for example, a silicon oxide film and the sacrificial film 40 may be, for example, a silicon nitride film. The inter-layer insulating film 25 and the sacrificial film 40 may be formed using, for example, chemical vapor deposition (CVD). The source line SL may be a conductive layer provided on a silicon substrate (not illustrated) and contains, for example, polysilicon.

Figure 4B:
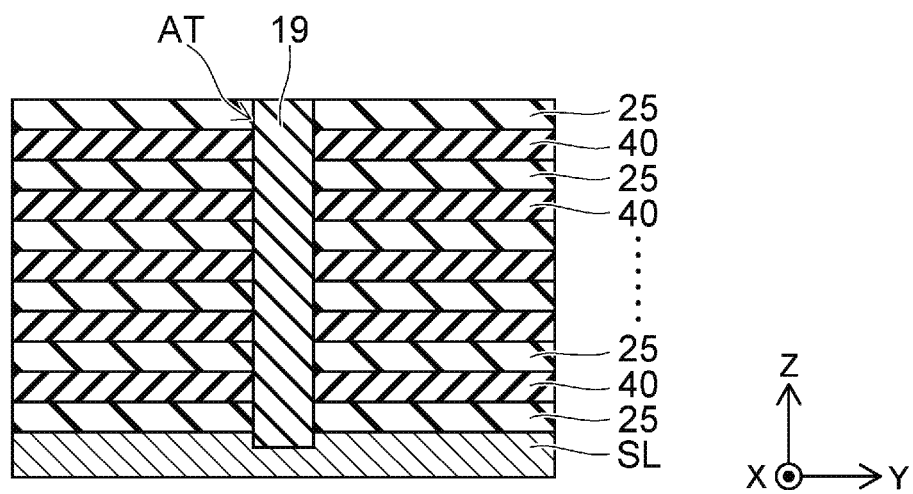

As illustrated in FIG. 4B, after a groove AT that has a depth reaching from the upper surface of the uppermost inter-layer insulating film 25 to the source line SL is formed, the insulating film 19 may be formed in the groove AT. For example, the groove AT may be formed to extend in the X direction (see FIG. 3A).

The groove AT may be formed by selectively removing the inter-layer insulating films 25 and the sacrificial films 40 using, for example, reactive ion etching (RIE). The insulating film 19 may be formed, for example, by applying polysilazan (PSZ) using a spin coating method and subsequently removing an upper portion of the uppermost inter-layer insulating film 25.

Figure 4C:
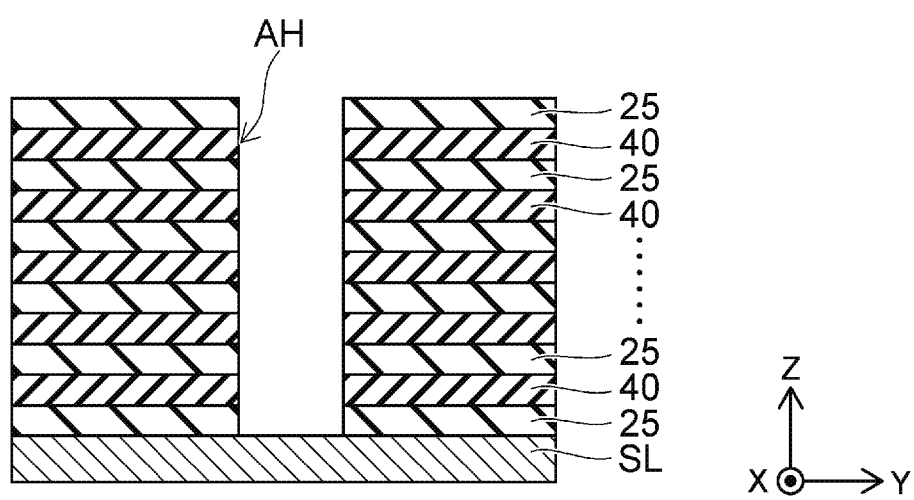

As illustrated in FIG. 4C, the memory hole AH that has the depth reaching from the upper surface of the uppermost inter-layer insulating film 25 to the source line SL may be formed. The plural memory holes AH may be formed along the groove AT (see FIG. 3A). The memory hole AH may be formed, for example, by selectively removing parts of the insulating film 19, the inter-layer insulating film 25, and the sacrificial film 40 using, for example, anisotropic RIE.

Figure 5A:
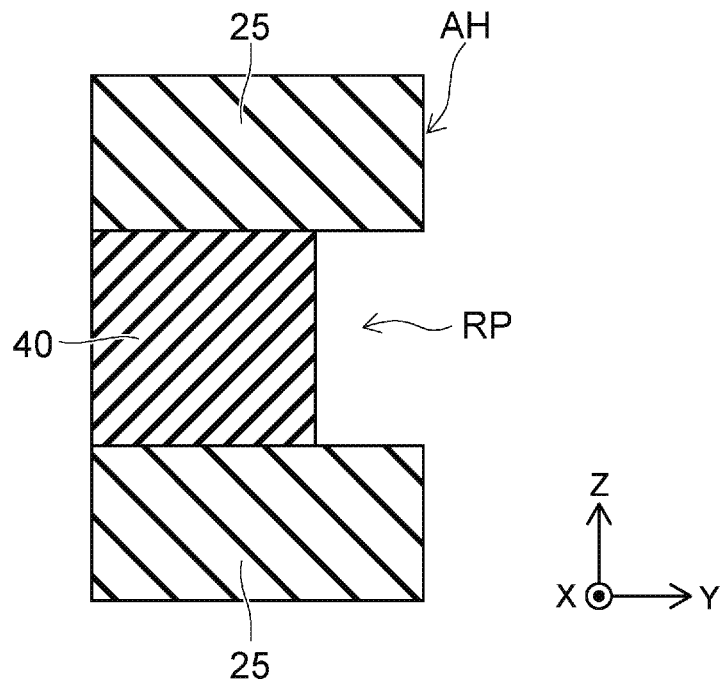
FIG. 5A and FIG. 5B are sectional views illustrating fabricating processes subsequent to FIG. 4A to FIG. 4C.

As illustrated in FIG. 5A, a recess portion RP may be formed by removing a part of the sacrificial film 40 inside the memory hole AH. A part of the sacrificial film 40 may be selectively removed, for example, by wet etching using thermal phosphoric acid.

Figure 5B:
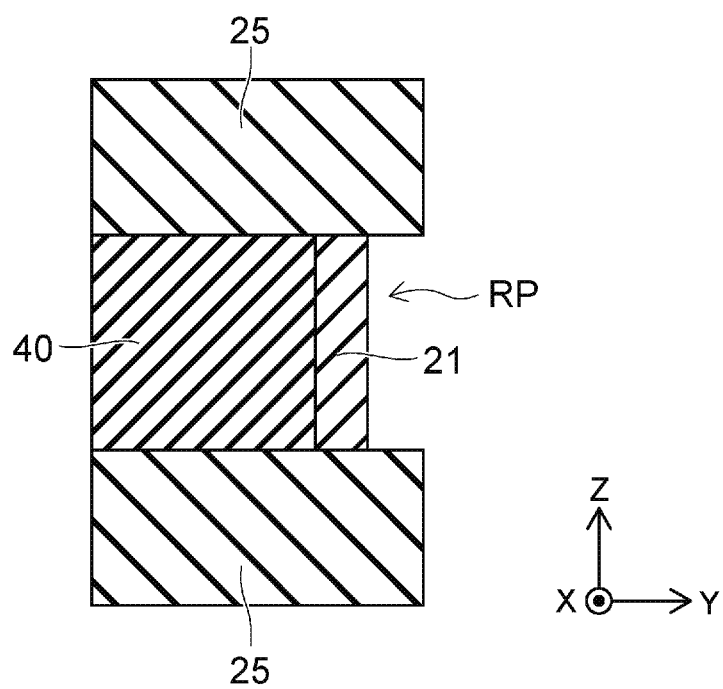

As illustrated in FIG. 5B, the insulating film 21 may be formed on the cross section by thermally oxidizing the sacrificial film 40. The insulating film 21 may be, for example, a silicon oxide film that has a thickness equal to or greater than 4.5 nm or preferably equal to 5 nm. The insulating film 21 may be formed so that a space for the recess portion RP remains between the inter-layer insulating films 25.

The insulating film 21 may be formed not only by oxidizing the sacrificial film 40 which is a silicon nitride film but also using CVD. In this case, the insulating film 21 may be formed uniformly not only on the surface of the sacrificial film 40 but also on a wall surface of the memory hole AH. Therefore, the shape of the insulating film 21 in the memory cell MC1 may be changed, and the stacked structure in the direction from the electrode layer 20 to the semiconductor layer 10 may be the same as the structure illustrated in FIG. 1, and thus it is possible to obtain the same effects.

The insulating film 21 is not limited to the silicon oxide film, and may be formed using a material capable of preventing a leakage current from the electrode layer 20. For example, aluminum oxide, lanthanum oxide, lanthanum silicate (LaSiO), or lanthanum aluminum silicate (LaAlSiO) may be used.

Figure 6A:
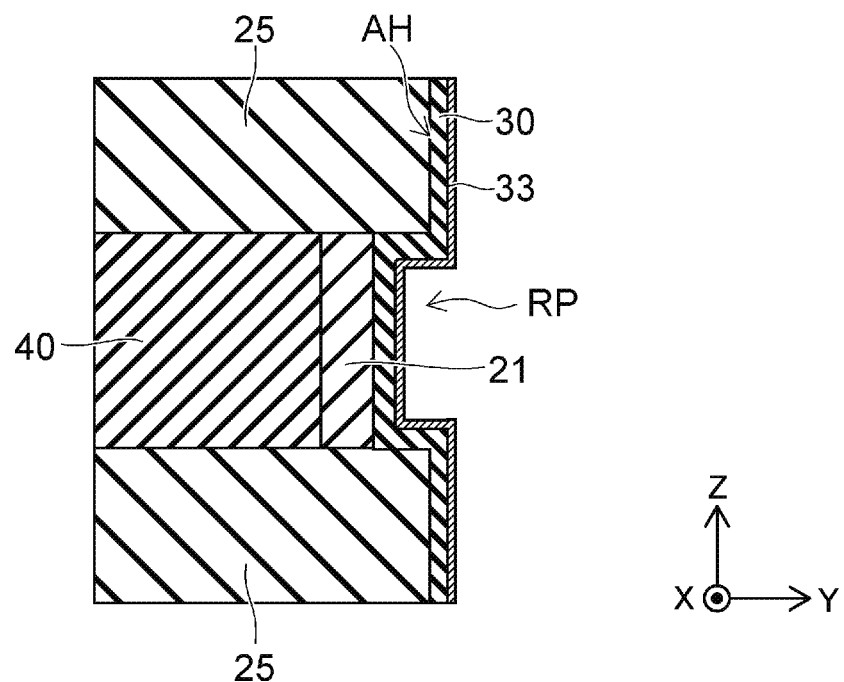
FIG. 6A and FIG. 6B are sectional views illustrating fabricating processes subsequent to FIG. 5A and FIG. 5B.

As illustrated in FIG. 6A, the charge trapping film 30 and the metal layer 33 may be formed on the inner surface of the memory hole AH. In the recess portion RP, the charge trapping film 30 and the metal layer 33 may be stacked on the insulating film 21. The charge trapping film 30 and the metal layer 33 may be formed so that a space remains inside the recess portion RP. The charge trapping film 30 and the metal layer 33 may be formed using, for example, CVD.

The charge trapping film 30 may be, for example, a hafnium silicate film with a thickness of 2 to 5 nm. A content of silicon of hafnium silicate (HfSiO) of the hafnium silicate film may be, for example, equal to or less than 30 mole %. Instead of hafnium silicate, zirconium silicate (ZrSiO) can also be used.

The metal layer 33 may contain, for example, metal such as ruthenium (Ru). The metal layer 33 may preferably contain a metallic element of an oxide with a metal property. The metal layer 33 may be formed to have a thickness equal to or less than 0.1 nm. The metal layer 33 may be, for example, a thin film that contains a desired metal element formed on the surface of the charge trapping film 30 using plasma doping.

Figure 6B:
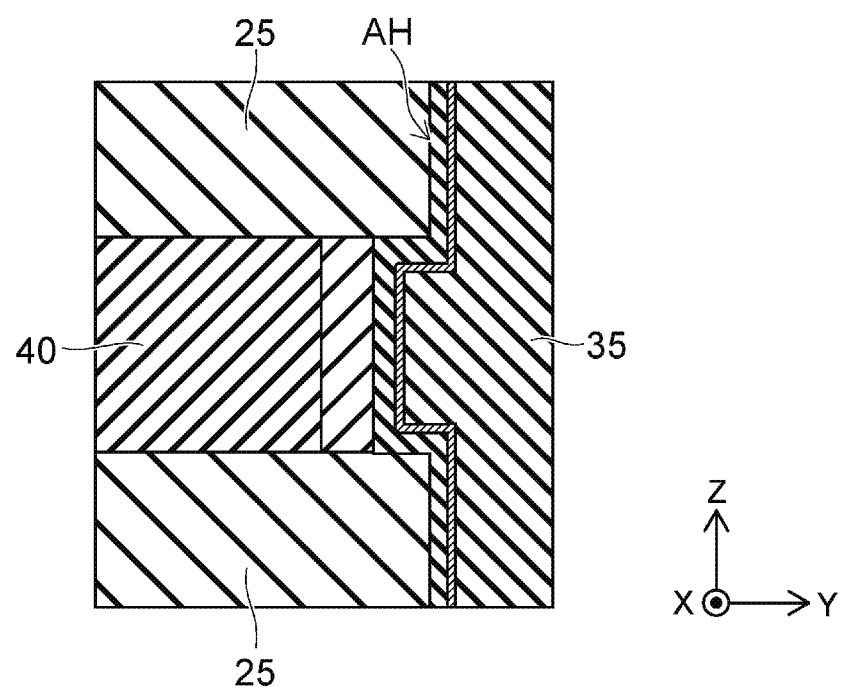

As illustrated in FIG. 6B, a mask material 35 covering the inner surface of the memory hole AH may be formed. The mask material 35 may be, for example, silicon nitride and may be formed to have a thickness with which the mask material 35 is buried in the inside of the recess portion RP (or is filled with the mask material 35).

Figure 7A:
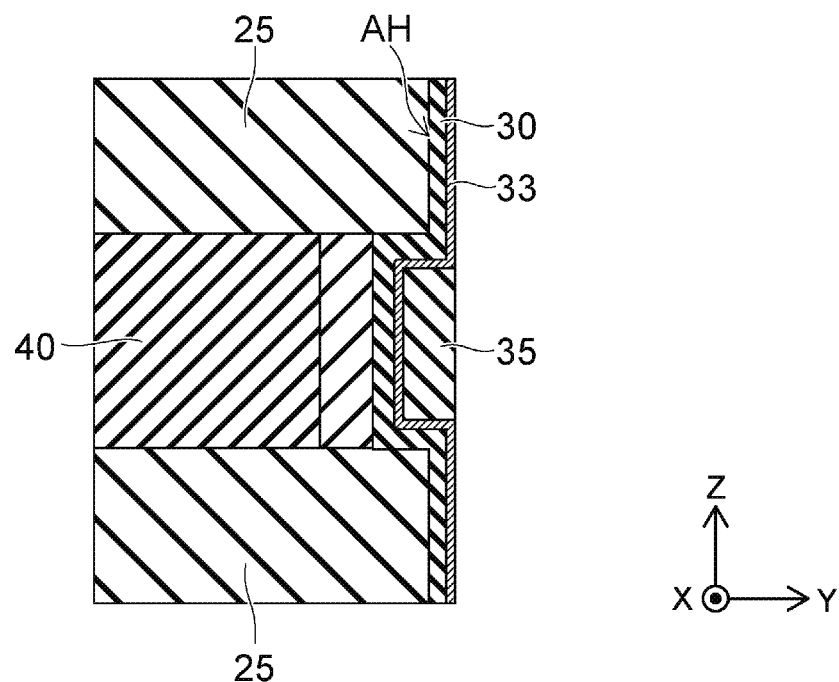
FIG. 7A and FIG. 7B are sectional views illustrating fabricating processes subsequent to FIG. 6A and FIG. 6B.

As illustrated in FIG. 7A, a portion of the mask material 35 which is buried in the recess portion RP (or a portion of the mask material 35 with which the recess portion RP is filled) may remain and the mask material 35 may be removed. The mask material 35 is removed using, for example, anisotropic RIE.

Figure 7B:
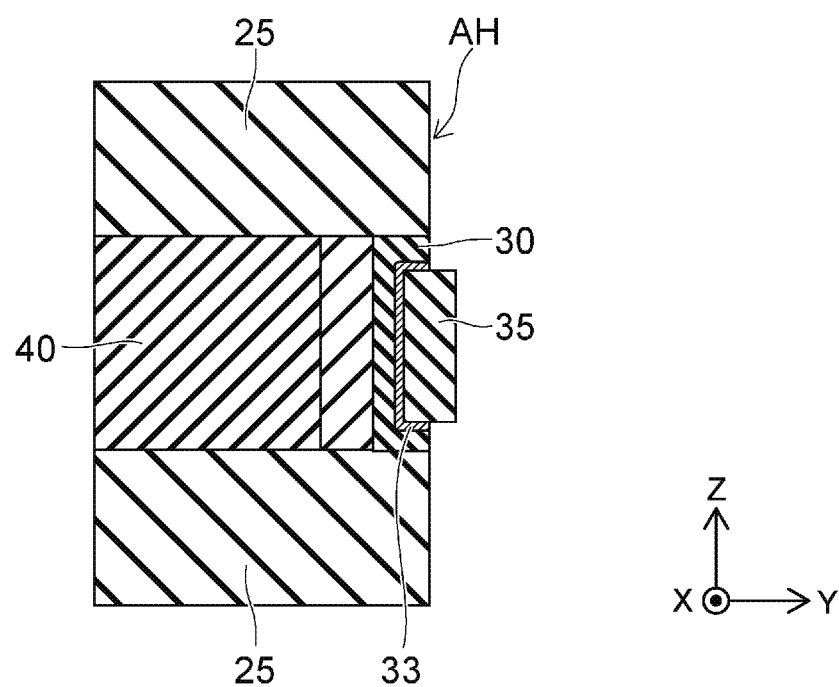

As illustrated in FIG. 7B, the metal layer 33 and the charge trapping film 30 formed on a cross section of the inter-layer insulating film 25 may be sequentially removed. When the metal is selectively removed, for example, hydrochloric acid may be used. When hafnium silicate (HfSiO) is selectively removed, for example, sulfuric acid can be used. The portion formed in the recess portion RP of the charge trapping film 30 and the metal layer 33 may be protected by the mask material 35, and thus may remain on the insulating film 21.

Figure 8A:
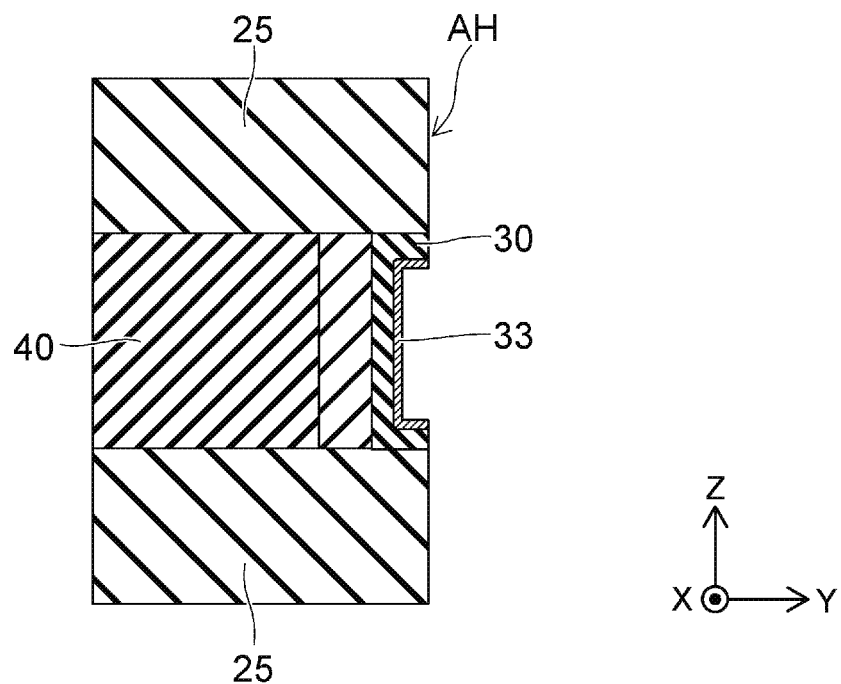
FIG. 8A and FIG. 8B are sectional views illustrating fabricating processes subsequent to FIG. 7A and FIG. 7B.

As illustrated in FIG. 8A, the mask material 35 remaining inside the recess portion RP may be selectively removed. The mask material 35 may be selectively removed, for example, by wet etching using thermal phosphoric acid.

Figure 8B:
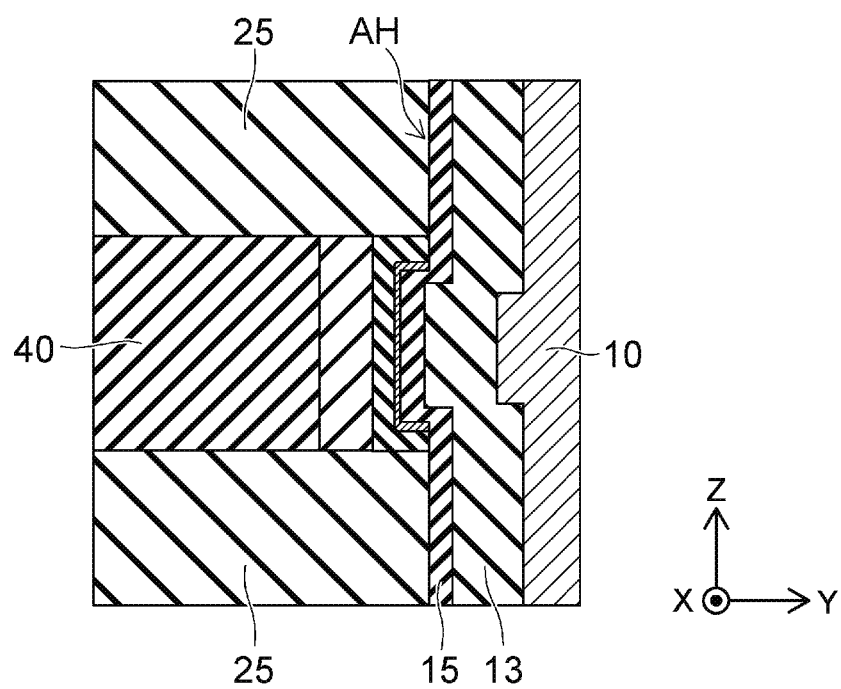

As illustrated in FIG. 8B, the semiconductor layer 10 and the insulating films 13 and 15 covering the inner surface of the memory hole AH may be formed. For example, the insulating film 15 may be formed to be in contact with the metal layer 33 in the recess portion RP. The insulating film 13 may be formed to be in contact with the insulating film 15. The semiconductor layer 10 may be formed to be in contact with the insulating film 13.

The insulating film 13 may be, for example, a silicon oxide film that has a thickness of 5 to 8 nm and preferably a thickness of 7 nm. The insulating film 15 may be, for example, a silicon nitride film that has a thickness of 1.5 to 5 nm and preferably a thickness of 3 nm. The insulating films 13 and 15 may be formed using, for example, CVD. Before the semiconductor layer 10 is formed, the insulating films 13 and 15 may be selectively removed while remaining the portion formed on the inner wall of the memory hole AH. Thereafter, the semiconductor layer 10 covering the inner surface of the memory hole AH may be formed. Thus, the semiconductor layer 10 may be formed to be in contact with the source line SL exposed to the bottom surface of the memory hole AH (see FIG. 3B).

Figure 9A:
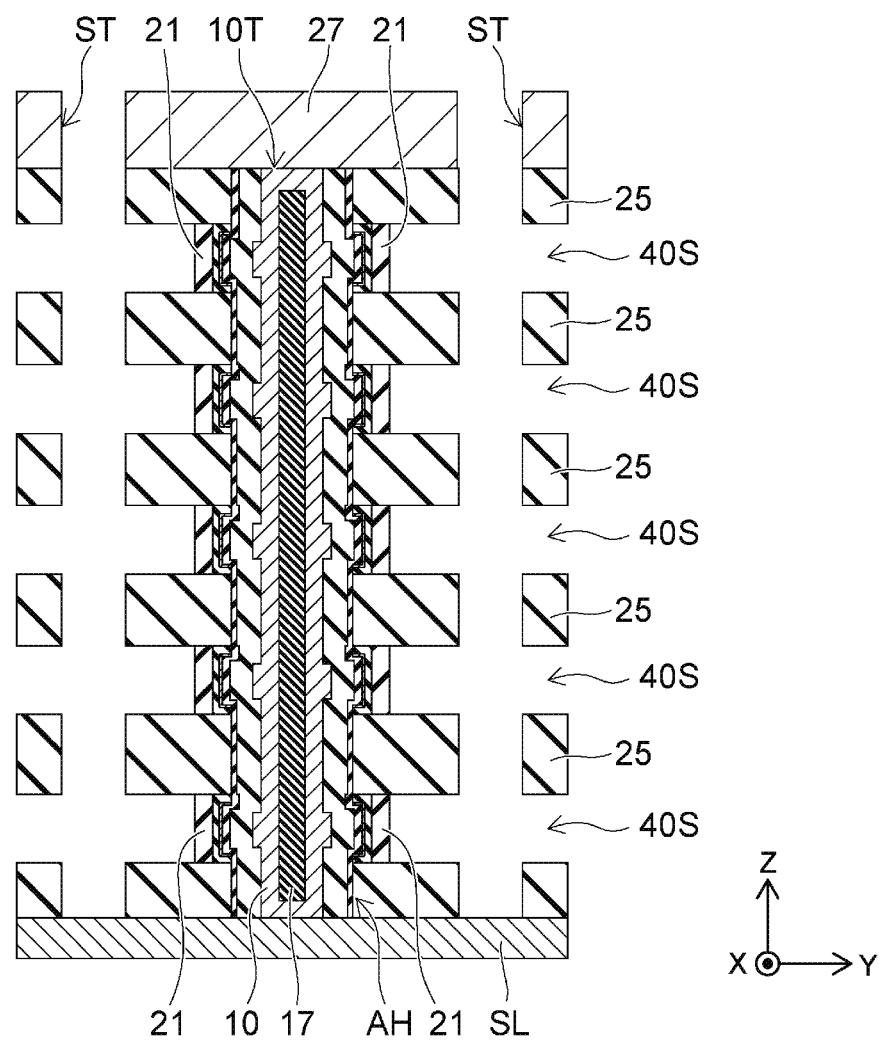
FIG. 9A and FIG. 9B are sectional views illustrating fabricating processes subsequent to FIG. 8A and FIG. 8B.

As illustrated in FIG. 9A, after the insulating core 17 which is buried in the inner space of the memory holes AH is formed, an upper end 10T of the semiconductor layer 10 may be formed to cover the upper end of the insulating core 17. Thereafter, the insulating film 27 may be formed to cover the uppermost inter-layer insulating film 25 and the semiconductor layer 10. The semiconductor layer 10 may be, for example, a polysilicon layer and the insulating film 27 may be, for example, a silicon oxide film. The semiconductor layer 10 and the insulating film 27 may be formed using, for example, CVD.

Subsequently, a slit ST that has a depth reaching from the upper surface of the insulating film 27 to the source line SL and extends in the X direction may be formed. Further, an etchant may be supplied via the slit ST to selectively remove the sacrificial film 40. Thus, a space 40S may be formed between the inter-layer insulating films 25.

Figure 9B:
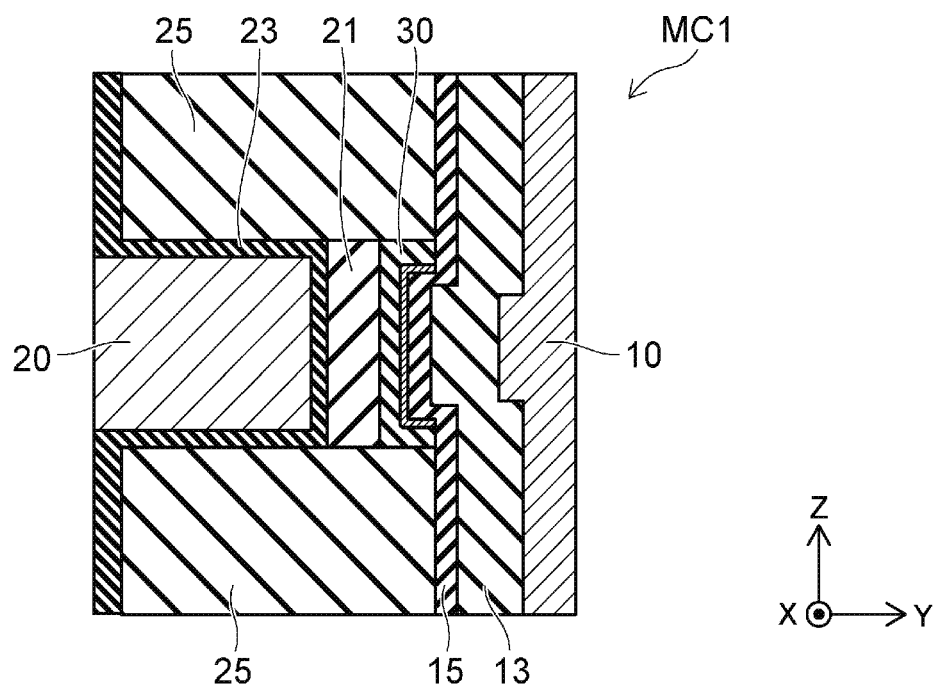

As illustrated in FIG. 9B, the electrode layer 20 and the insulating film 23 may be formed inside the space 40S. The insulating film 23 may be formed to cover the inner surface of the space 40S. The electrode layer 20 may be formed to be buried in the inner space of the space 40S. The electrode layer 20 and the insulating film 23 may be formed using, for example, CVD.

The insulating film 23 may be, for example, an aluminum oxide film with a thickness of 1 to 3 nm. Instead of aluminum oxide ($Al_2O_3$), for example, hafnium silicate (HfSiO) or zirconium silicate (ZrSiO) may be used as the material of the insulating film 23.

The electrode layer 20 may have, for example, a structure in which titanium nitride (TiN) and tungsten (W) are stacked. That is, after a titanium nitride film covering the insulating film 23 is formed as a barrier film, a tungsten film which is buried in the space 40S may be formed.

Subsequently, after an insulating film (not illustrated) which is buried in the inside of the slit ST is formed, the bit line BL may be formed on the insulating film 27 to complete the memory device 1 (see FIG. 3B). The bit line BL may be connected to the semiconductor layer 10 via the connection plug CB (see FIG. 3B).

In the foregoing example, the memory hole AH may be formed after the groove AT is formed (see FIG. 3A and FIG. 3B). Therefore, the shape of the memory cell MC when viewed from the upper side is formed, as illustrated in FIG. 3A, but the memory cell MC may have another shape caused by a difference in the fabricating processes. For example, when the memory hole AH is formed without forming the groove AT, the memory cell MC may be formed in a concentric circle. In a procedure in which the groove AT is formed after the semiconductor layer 10 and the insulating films 13 and 15 are formed inside the memory hole AH, the semiconductor layer 10 and the insulating films 13 and 15 also may be formed to be separated into the MCA side and the MCB side by the groove AT. In either case, the cross-sectional structure along the Y-Z planar surface of the memory cell MC may be the same as the structure illustrated in FIG. 1 or 9B. Therefore, it is possible to obtain the same effects as the memory device 1.

Figure 10A:
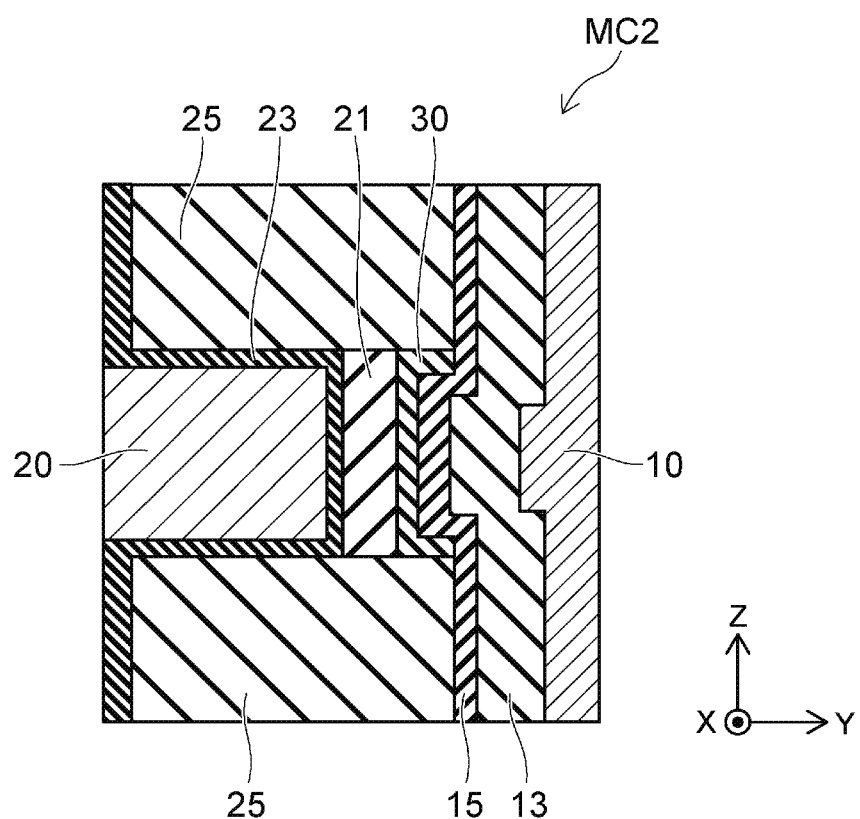
FIG. 10A and FIG. 10B are sectional views illustrating memory cells according to a modification example.
Figure 10B:
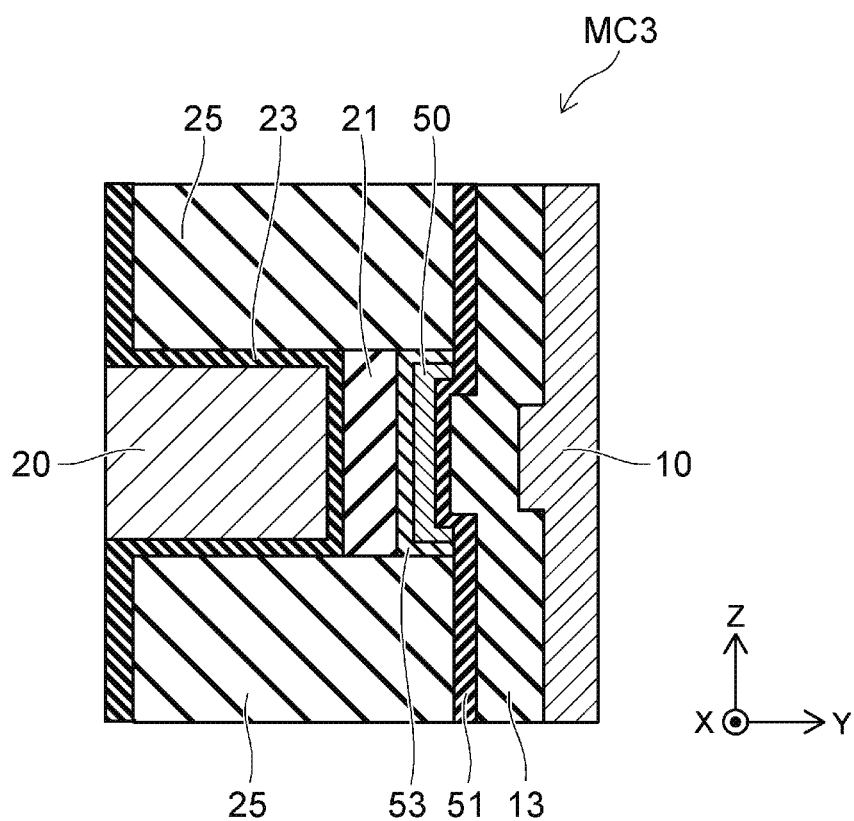

FIG. 10A and FIG. 10B are sectional views illustrating memory cells MC2 and MC3 according to a modification example. FIG. 10A and FIG. 10B illustrate the cross section corresponding to the region surrounded by dotted lines illustrated in FIG. 3B.

As illustrated in FIG. 10A, the memory cell MC2 includes the charge trapping film 30 between the semiconductor layer 10 and the electrode layer 20. In this example, the metal layer 33 is not provided between the insulating film 15 and the charge trapping film 30. The memory cell MC2 may be used when it is important to prevent migration of metal elements from the metal layer 33.

As illustrated in FIG. 10B, the memory cell MC3 includes a metal layer 50 functioning as a charge storage unit between the semiconductor layer 10 and the electrode layer 20. The metal layer 50 may contain, for example, titanium nitride (TiN) and high energy level density. Therefore, it is possible to form a charge retention region with high charge storage capability.

The metal layer 50 may contain tungsten (W), tungsten nitride (WN), or tantalum nitride (TaN). The metal layer 50 may have, for example, a thickness of 0.5 to 5 nm and preferably a thickness of 1 nm.

The memory cell MC3 includes an insulating film 51 between the insulating film 13 and the metal layer 50 and includes an insulating film 53 between the insulating film 21 and the metal layer 50. The insulating films 51 and 53 may be, for example, silicon nitride films with a thickness of 2.5 nm and prevent migration of metal elements from the metal layer 50. The insulating film 51 may have a second trap level TL2 and facilitates data erasing in the memory cell MC3 (see FIG. 2B).

The memory cell MC3 can be generated by forming the insulating film 53 instead of the charge trapping film 30 in the process illustrated in FIG. 6A and forming the metal layer 50 instead of the metal layer 33.

Figure 11A:
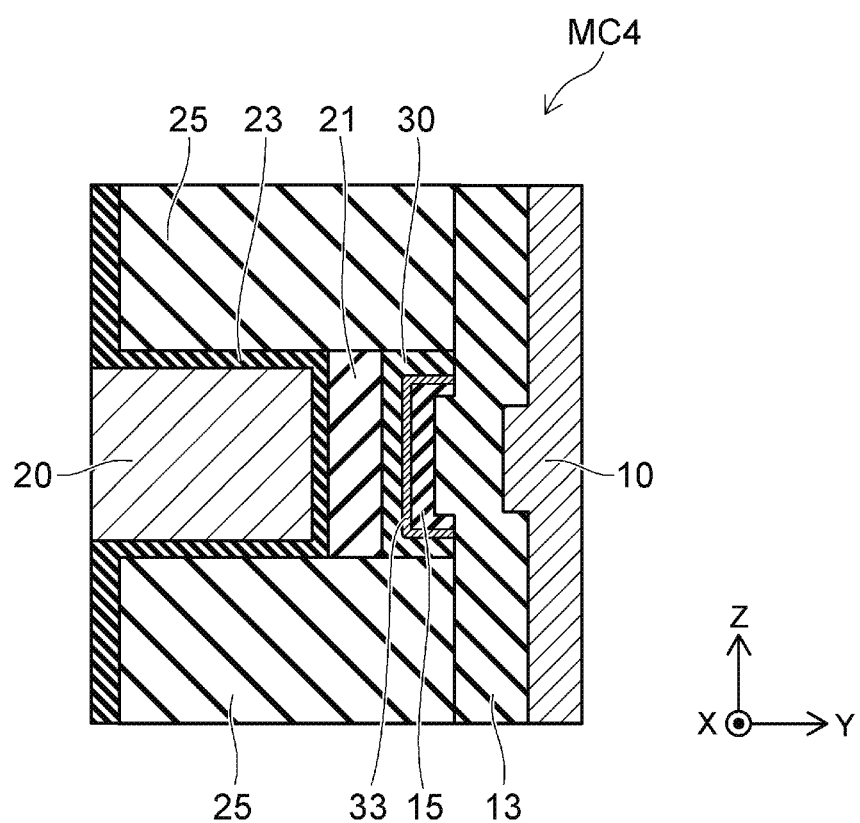
FIG. 11A and FIG. 11B are sectional views illustrating memory cells according to another modification example.
Figure 11B:
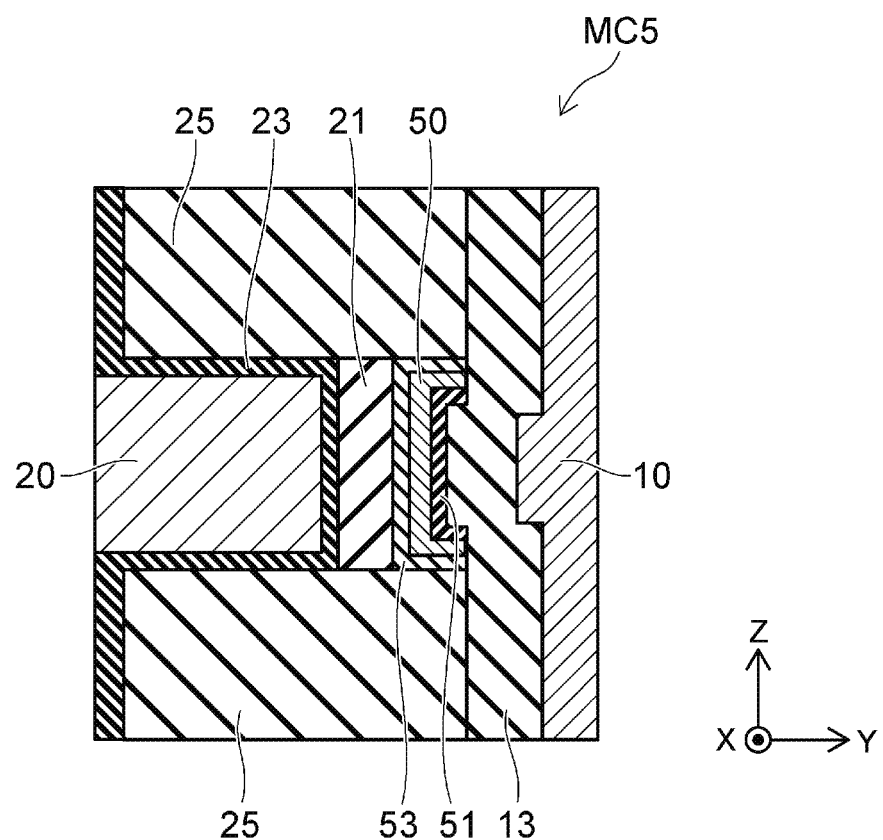

FIG. 11A and FIG. 11B are sectional views illustrating memory cells MC4 and MC5 according to a modification example. FIG. 11A and FIG. 11B illustrate the cross section corresponding to the region surrounded by dotted lines illustrated in FIG. 3B.

As illustrated in FIG. 11A, the memory cell MC4 includes the charge trapping film 30 between the semiconductor layer 10 and the electrode layer 20. The memory cell MC4 further includes the metal layer 33 between the insulating film 15 and the charge trapping film 30. The insulating film 15 illustrated in this example is discretely provided between the semiconductor layer 10 and the charge trapping film 30.

The memory cell MC5 illustrated in FIG. 11B includes the metal layer 50 between the semiconductor layer 10 and the electrode layer 20. The insulating film 51 illustrated in this example is discretely provided between the semiconductor layer 10 and the metal layer 50.

In the memory cell MC4, the insulating film 15 is not connected in the Z direction so as to prevent charges from moving between the memory cells via the second trap level TL2 of the insulating film 15 (see FIG. 11A). In the memory cell MC5, the insulating film 51 is not connected in the Z direction so as to prevent charges from moving between the memory cells via the second trap level TL2 of the insulating film 51. Thus, for example, it is possible to thinly form the inter-layer insulating films 25 and narrow an interval between the memory cells in the Z direction. As a result, it is possible to increase the number of stacked electrode layers 20 and increase the memory capacity of the memory device 1.

Figure 12A:
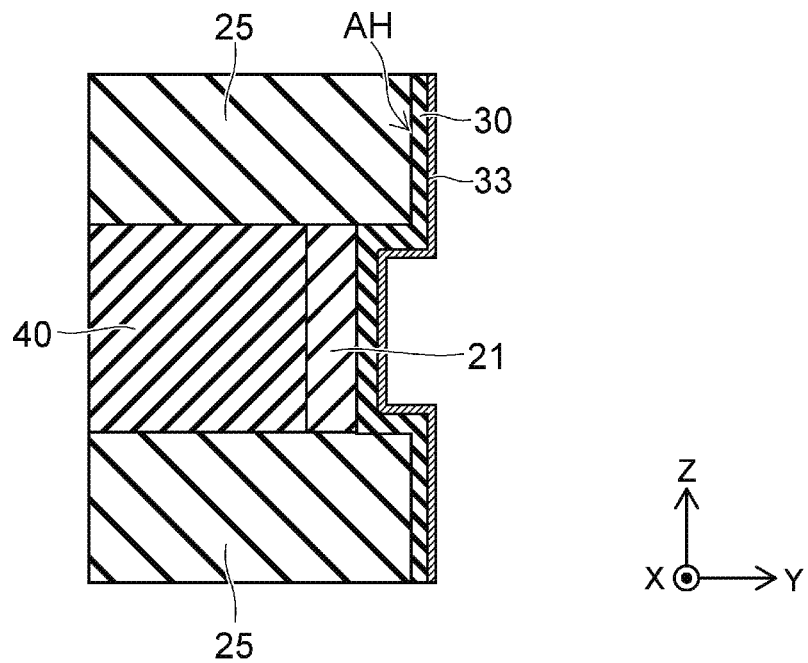
FIG. 12A and FIG. 12B are sectional views illustrating a memory cell according to still another modification example.

Next, a method of fabricating a memory device according to the modification example will be described with reference to FIG. 12A to FIG. 14B. FIG. 12A and FIG. 14B are sectional views illustrating a method of fabricating the memory cell MC4 and illustrating fabricating processes subsequent to FIG. 5B.

Figure 12B:
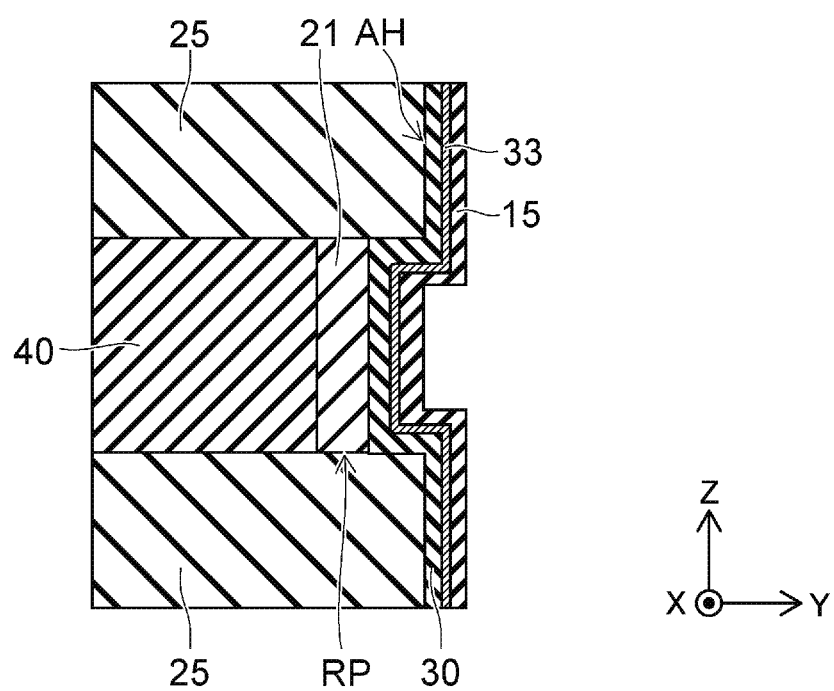

As illustrated in FIG. 12A, after the charge trapping film 30 and the metal layer 33 are formed to cover the inner surface of the memory hole AH, as illustrated in FIG. 12B, the insulating film 15 may be formed. The insulating film 15 may be formed to cover the metal layer 33. The charge trapping film 30, the metal layer 33, and the insulating film 15 may be formed to have a thickness with which a depression corresponding to the recess portion RP is defined.

Figure 13A:
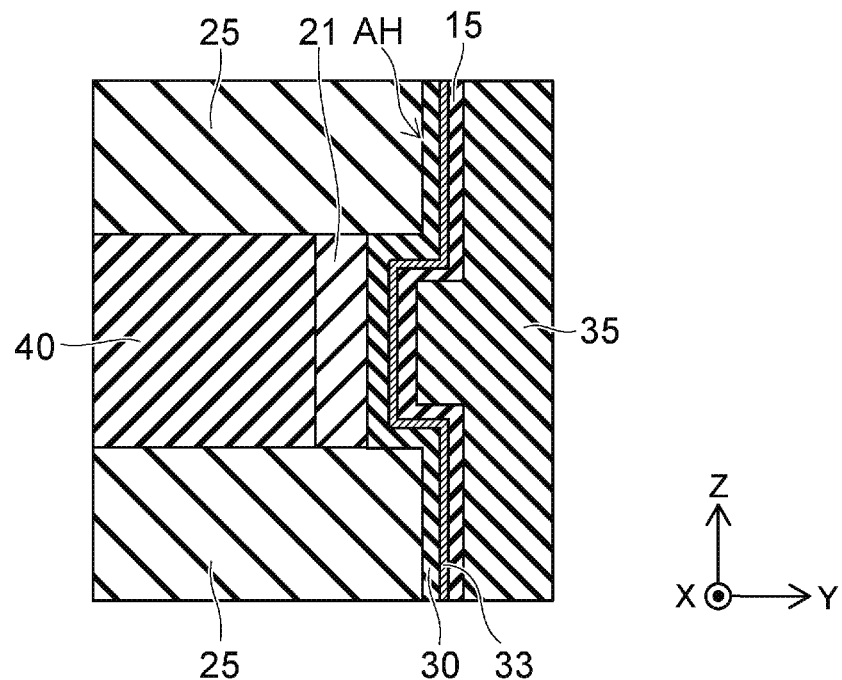
FIG. 13A and FIG. 13B are sectional views illustrating processes of fabricating a memory device according to the modification example.

As illustrated in FIG. 13A, the mask material 35 with a thickness with which the mask material 35 is buried in the depression may be formed. The mask material 35 may have a thickness with which a surface exposed in the memory hole AH is substantially flat. The mask material 35 may contain, for example, silicon oxide.

Figure 13B:
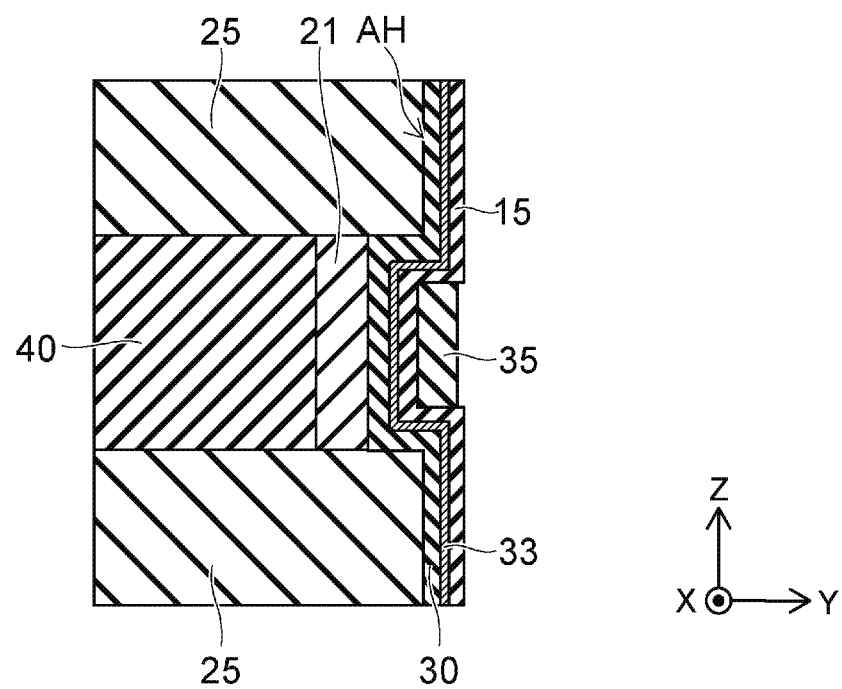

As illustrated in FIG. 13B, the mask material 35 may be removed so that a portion thereof which is buried in the depression remains. The mask material 35 may be removed using, for example, anisotropic RIE.

Figure 14A:
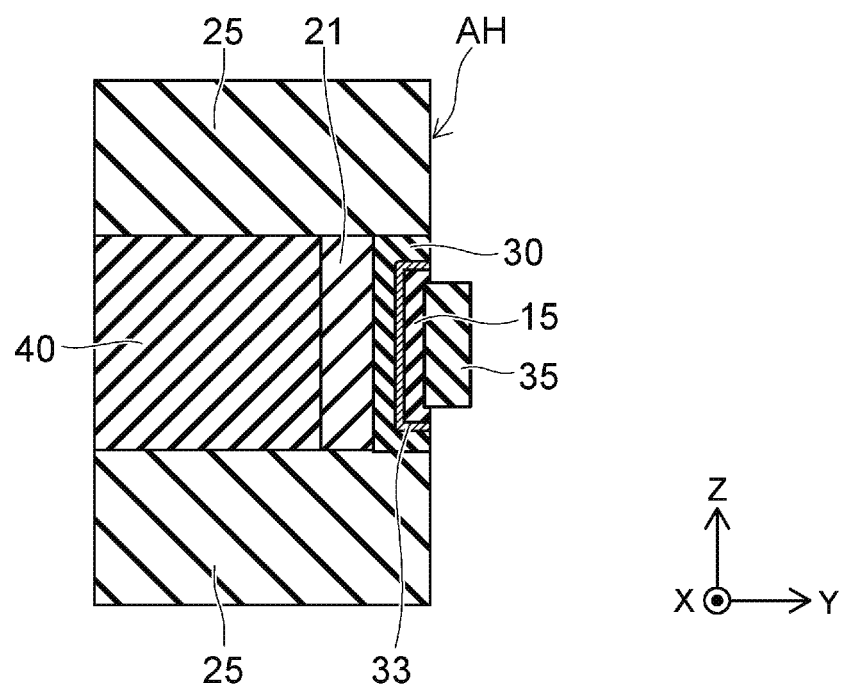
FIG. 14A and FIG. 14B are sectional views illustrating fabricating processes subsequent to FIG. 13A and FIG. 13B.
Figure 14B:
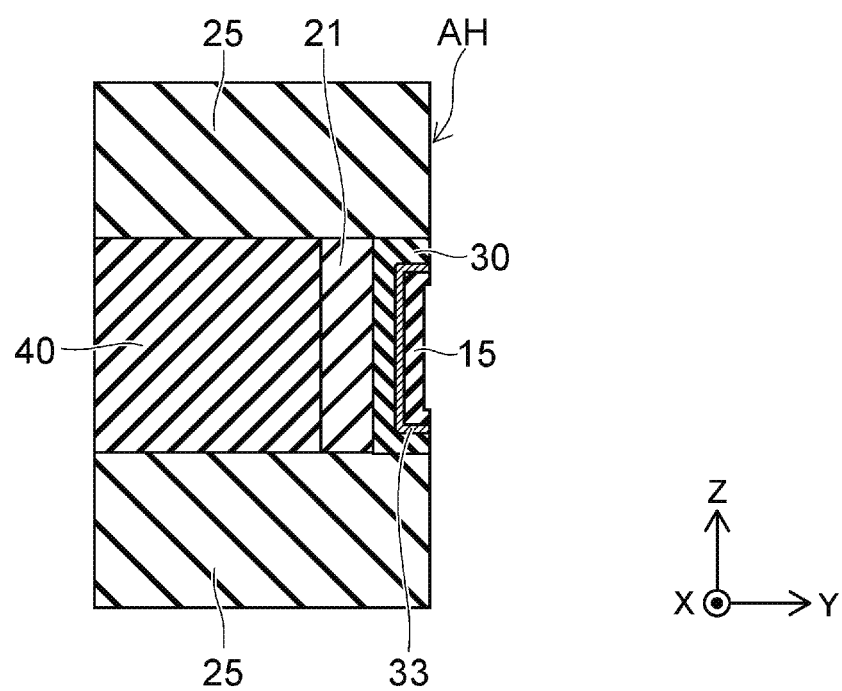

As illustrated in FIG. 14A, the insulating film 15, the metal layer 33, and the charge trapping film 30 may be sequentially removed using the mask material 35 as an etching mask to expose the end surfaces of the inter-layer insulating films 25. Thus, parts of the insulating films 15, the metal layer 33, and the charge trapping film 30 may remain between the inter-layer insulating films 25.

As illustrated in FIG. 14B, the mask material 35 may be selectively removed until the mask material 35 is completely removed. By using, for example, polysilazan (PSZ) as the material of the mask material 35, it is possible to selectively remove the inter-layer insulating films 25. Subsequently, by forming the insulating film 13 and the semiconductor layer 10 to cover the end surfaces of the inter-layer insulating films 25 and the insulating film 15, it is possible to form the memory cell MC4.

Figure 15A:
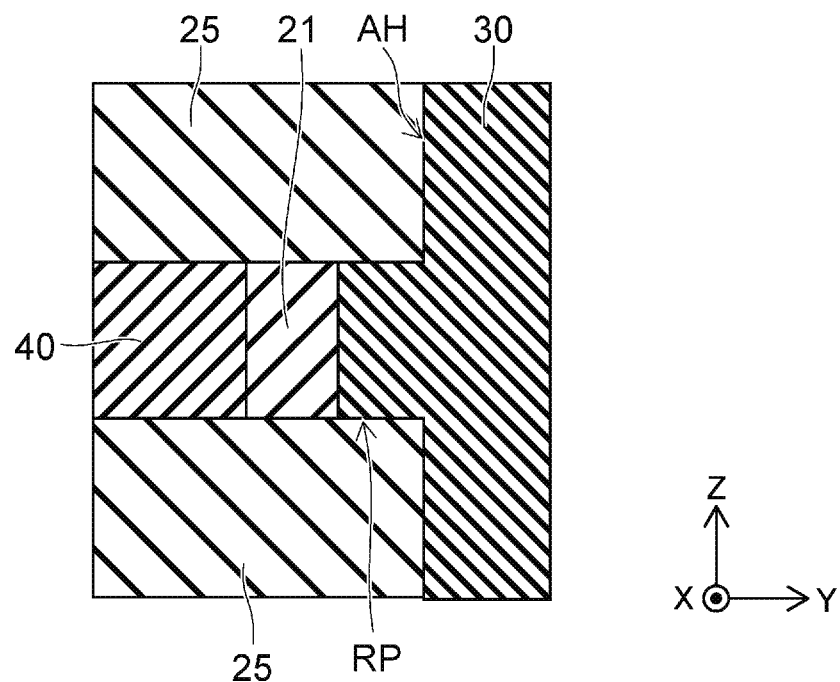
FIG. 15A and FIG. 15B are sectional views illustrating fabricating processes subsequent to FIG. 14A and FIG. 14B.

Next, a method of fabricating a memory device according to another modification example will be described with reference to FIG. 15A to FIG. 16B. FIG. 15A and FIG. 16B are sectional views illustrating, for example, a method of fabricating the memory cell MC2 and illustrating fabricating processes subsequent to FIG. 5B.

As illustrated in FIG. 15A, the charge trapping film 30 may be formed to be buried in the recess portion RP. The charge trapping film 30 may be formed to have a thickness with which a surface exposed in the memory hole AH is substantially flat.

Figure 15B:
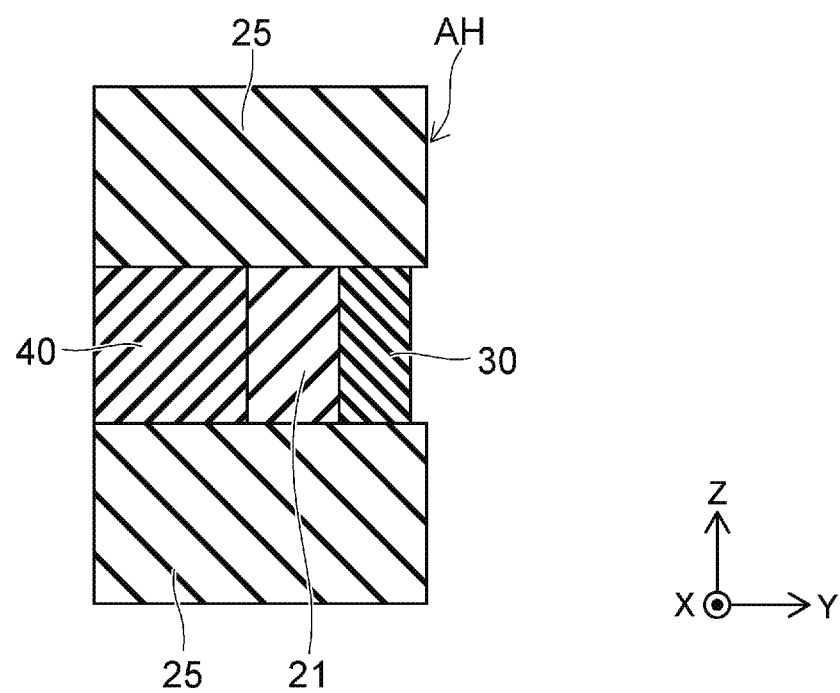

As illustrated in FIG. 15B, the charge trapping film 30 may be removed such that a portion thereof which is buried in the recess portion RP remains. The charge trapping film 30 may be removed, for example, by wet etching using a sulphuric acid solution. The charge trapping film 30 may be formed to have a thickness of about 3 nm in the Y direction inside the recess portion RP.

Figure 16A:
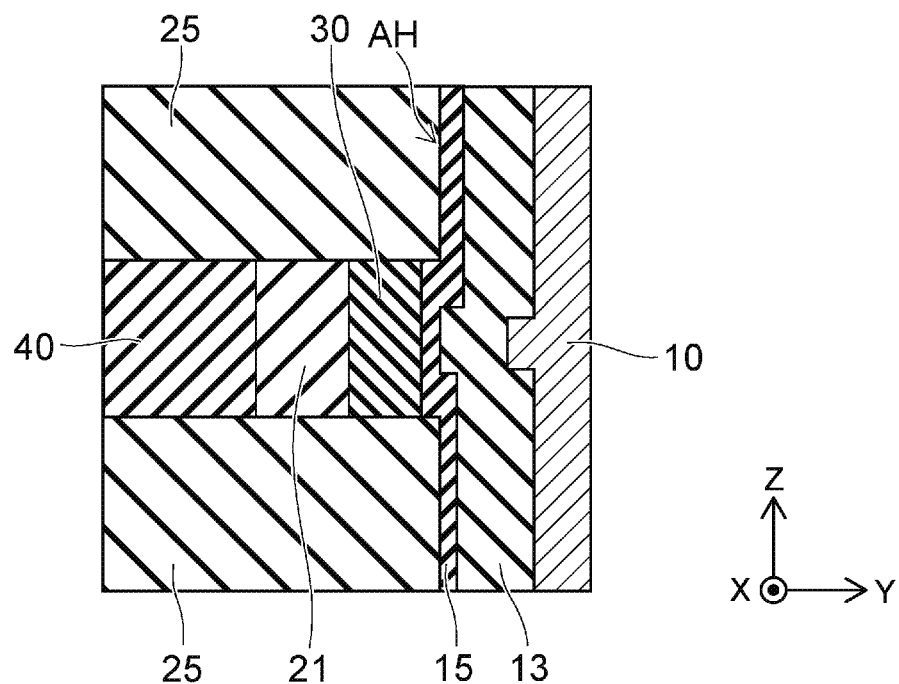
FIG. 16A and FIG. 16B are sectional views illustrating fabricating processes according to the another modification example.
Figure 16B:
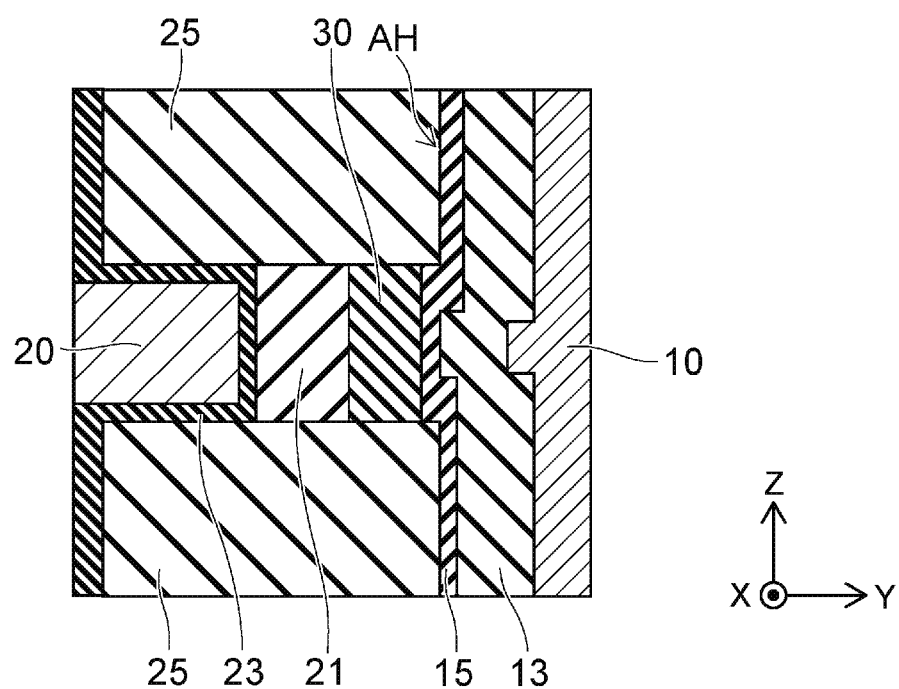

As illustrated in FIG. 16A, the insulating films 13 and 15 and the semiconductor layer 10 may be formed to cover the inner surface of the memory hole AH. The insulating film 15 may have a thickness of about 3 nm and may be formed to be in contact with the charge trapping film 30 and the inter-layer insulating films 25. The insulating film 13 may have a thickness of about 7 nm and may be formed to be in contact with the insulating film 15. The semiconductor layer 10 may be formed to be in contact with the insulating film 13.

As illustrated in FIG. 16B, the memory cell MC2 may be completed by replacing the sacrificial film 40 with the electrode layer 20 and the insulating film 23. In this example, the memory cell MC2 can be formed without using the mask material 35.

For example, this example is advantageous when the thickness of the sacrificial film 40 is thin and it is difficult to form the mask material 35 inside the recess portion RP. Since the mask material 35 is not used, the fabricating processes can be simplified.

Figure 17:
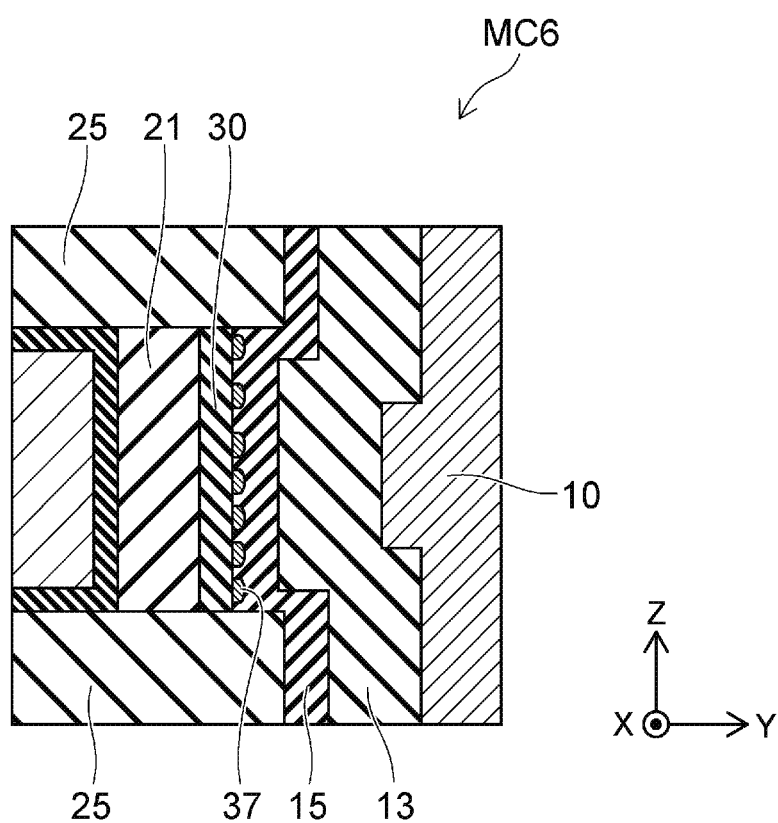
FIG. 17 is a sectional view illustrating fabricating processes subsequent to FIG. 16A and FIG. 16B.

FIG. 17 is a sectional view illustrating a memory cell MC6 according to further another modification example. FIG. 17 is a view illustrating a cross section corresponding to a portion surrounded by dotted lines of FIG. 3B.

As illustrated in FIG. 17, the memory cell MC6 includes the charge trapping film 30 between the semiconductor layer 10 and the electrode layer 20. Further, the memory cell MC6 includes a metal layer 37 between the insulating film 15 and the charge trapping film 30. The metal layer 37 may be, for example, a discontinuous layer that includes plural island-shaped regions. That is, the metal layer 37 may contain, for example, minute metal such as ruthenium (Ru).

In this example, by providing the metal layer 37, it is possible to increase the density of the first trap level TL1 of the charge trapping film 30 and improve the charge retention capability of the memory cell MC6. Further, by reducing an amount of metal contained in the metal layer 37, it is also possible to prevent migration of metal elements.

Figure 18A:
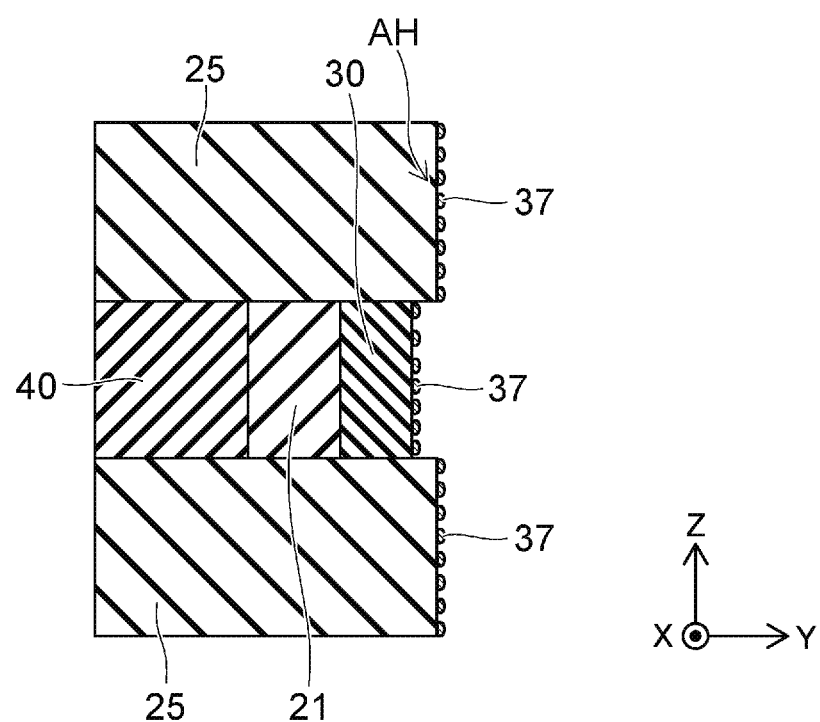
FIG. 18A and FIG. 18B are sectional views illustrating fabricating processes according to the still another modification example.
Figure 18B:
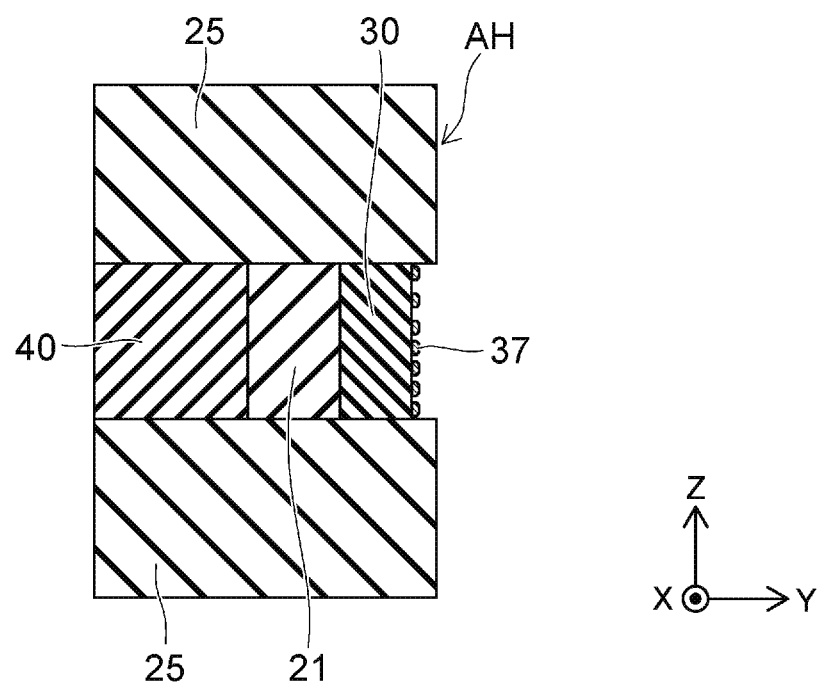

FIG. 18A and FIG. 18B are sectional views illustrating processes of fabricating the memory cell MC6. FIG. 18A and FIG. 18B illustrate fabricating processes subsequent to the process illustrated in FIG. 15B.

As illustrated in FIG. 18A, the metal layer 37 may be formed to cover the inner surface of the memory hole AH. The metal layer 37 may be formed using, for example, atomic layer deposition (ALD) and includes plural metal layers formed in an island shape.

As illustrated in FIG. 18B, the metal layer 37 may be removed so that a portion formed on the charge trapping film 30 remains. In this case, the metal layer 37 may be removed, for example, by partially etching the inter-layer insulating films 25 using a diluted hydrofluoric acid solution.

In this example, the metal layer 37 formed on the inter-layer insulating films 25 can be selectively removed without using the mask material 35. Thus, it is possible to simplify the processes of fabricating the memory cell MC6.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory device comprising:
   a plurality of electrode layers that are stacked in a first direction;
   a semiconductor layer that intersects with the plurality of electrode layers and extends in the first direction;
   a first insulating film that is provided between the semiconductor layer and at least one electrode layer among the plurality of electrode layers and extends along the semiconductor layer in the first direction;
   a charge trapping film that is provided between the electrode layer and the first insulating film; and
   a second insulating film that is provided between the charge trapping film and the first insulating film and is in contact with the first insulating film, wherein
   in a flat band state, the charge trapping film has a first trap level located at a level deeper than a conduction band of the semiconductor layer and the second insulating film has a second trap level located at a level closer to the conduction band of the semiconductor layer than the first trap level, and
   the charge trapping film includes a metal film.

2. The memory device according to claim 1, wherein the charge trapping film has a metal oxide as a main component.

3. The memory device according to claim 1, wherein the charge trapping film contains a hafnium silicate in which a content rate of silicon is equal to or less than 30 mole %.

4. The memory device according to claim 1, wherein the metal film contains titanium nitride.

5. The memory device according to claim 1, wherein the charge trapping film includes a metal oxide film.

6. The memory device according to claim 5, wherein the metal film contains ruthenium.

7. The memory device according to claim 1, wherein the metal film includes a plurality of island-shaped regions.

8. The memory device according to claim 1, further comprising:
   a plurality of charge trapping films including the charge trapping film,
   wherein the plurality of charge trapping films are disposed to be separated from each other between the plurality of electrode layers and the semiconductor layer.

9. The memory device according to claim 8, further comprising:
   a plurality of second insulating films that include the second insulting film,
   wherein the plurality of second insulating films are separated from each other between the plurality of charge trapping films and the first insulating film.

10. The memory device according to claim 1, wherein the second insulating film is an insulating film that includes a silicon nitride film as a main component.

* * * * *